United States Patent [19]

Stratas

[11] Patent Number: 5,722,159
[45] Date of Patent: Mar. 3, 1998

[54] METHOD FOR RETENTION OF A FRAGILE CONDUCTIVE TRACE WITH A PROTECTIVE CLAMP

[75] Inventor: Christopher John Stratas, Vestal, N.Y.

[73] Assignee: International Business Machines Corporation, Armonk, N.Y.

[21] Appl. No.: 639,570

[22] Filed: Apr. 29, 1996

Related U.S. Application Data

[62] Division of Ser. No. 369,066, Jan. 5, 1995, Pat. No. 5,653,599.

[30] Foreign Application Priority Data

Mar. 30, 1994 [CA] Canada ................... 2120280

[51] Int. Cl.⁶ ................................. H05K 3/30
[52] U.S. Cl. ................................. 29/832
[58] Field of Search ............... 29/827, 830, 831, 29/832

[56] References Cited

U.S. PATENT DOCUMENTS

| | | | |
|---|---|---|---|
| 3,407,925 | 10/1968 | Ruehlemann | 439/526 |
| 3,719,917 | 3/1973 | Fischer et al. | 439/73 |
| 4,363,076 | 12/1982 | McIver | 361/386 |
| 4,547,031 | 10/1985 | Korsunsky | 439/73 |
| 4,696,526 | 9/1987 | Newton et al. | 439/68 |
| 4,744,009 | 5/1988 | Grabbe et al. | 439/55 |
| 4,758,176 | 7/1988 | Abe et al. | 439/331 |
| 4,768,973 | 9/1988 | Bakermans | 439/331 |
| 4,852,250 | 8/1989 | Andrews | 29/827 |
| 5,005,070 | 4/1991 | Altendorf et al. | 357/74 |
| 5,046,453 | 9/1991 | Shreeve et al. | 29/840 |
| 5,099,392 | 3/1992 | Miller et al. | 361/400 |
| 5,113,580 | 5/1992 | Schroeder et al. | 29/827 |
| 5,162,975 | 11/1992 | Matta et al. | 439/73 |
| 5,223,063 | 6/1993 | Yamazaki et al. | 29/827 |
| 5,253,415 | 10/1993 | Dennis | 29/827 |
| 5,379,188 | 1/1995 | Winslow | 361/760 |

OTHER PUBLICATIONS

IBM Technical Disclosure Bulletin, vol. 34, No. 11, Apr. 1992, "Method of Bonding Tape Automated Bonding Packages Using Conventional Surface Mount Technologies", pp. 234–236.

*Primary Examiner*—Larry I. Schwartz
*Attorney, Agent, or Firm*—Lawrence R. Fraley

[57] ABSTRACT

A module having an apertured conductive trace and an apertured substrate is disclosed wherein a clamp protectively retains the trace on the substrate. The clamp has a base with a number of retention means, such as posts, projecting downwardly therefrom, each of the retention means having a retention section adapted for retaining engagement with a corresponding aperture in the conductive trace. Each of the retention means is further adapted for fastening engagement with a corresponding aperture in the substrate.

7 Claims, 7 Drawing Sheets

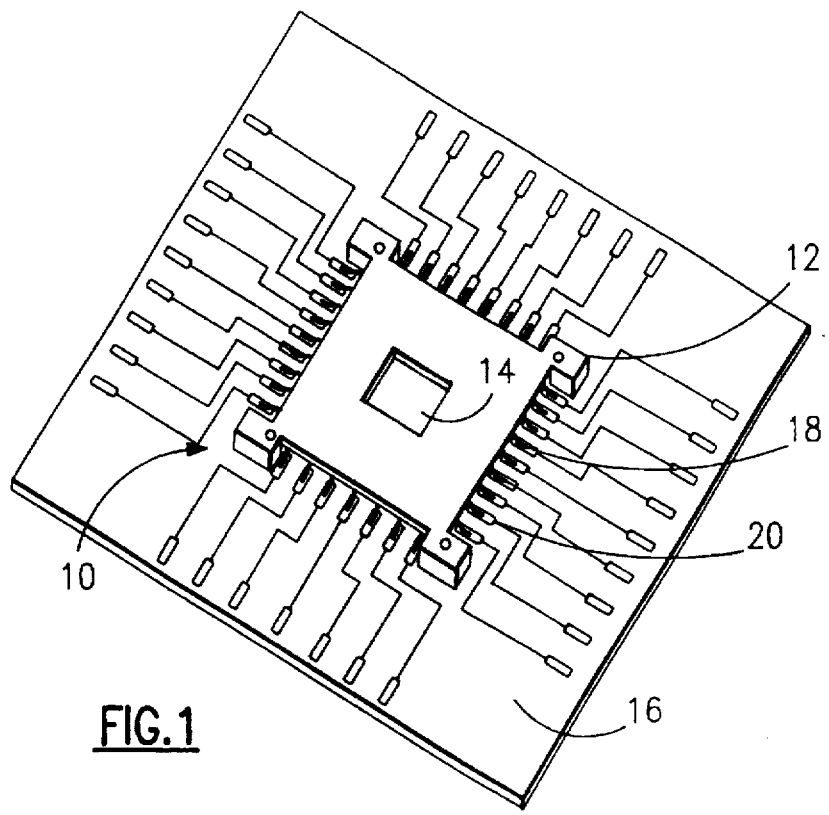
FIG.1
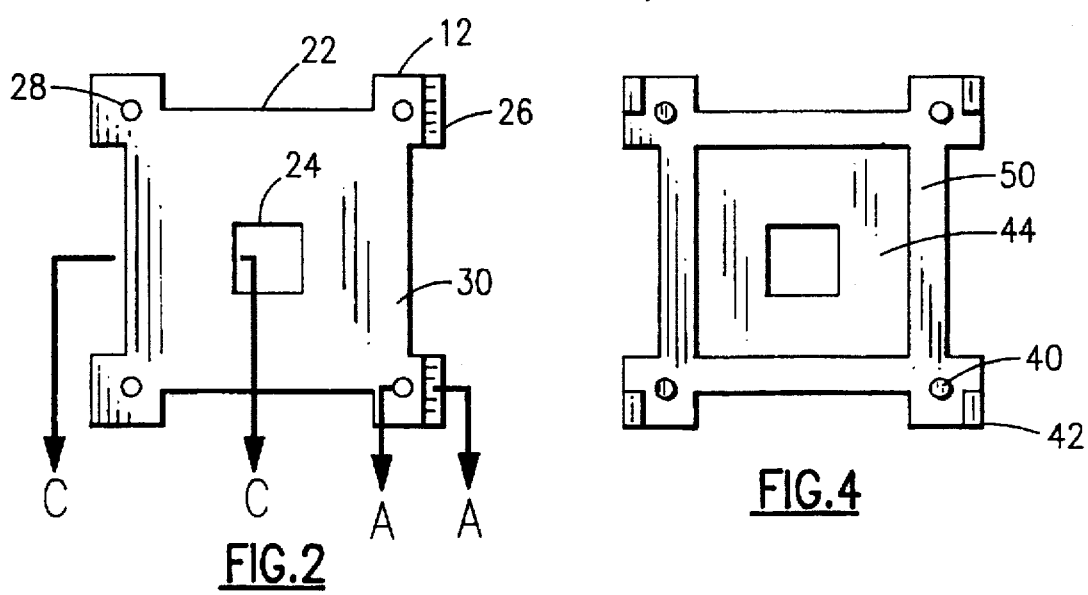
FIG.2
FIG.4
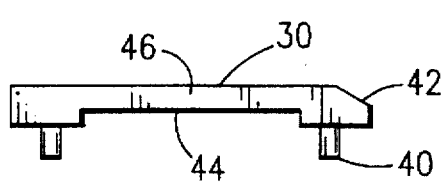
FIG.3
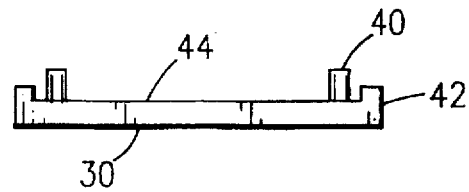
FIG.5

METHOD FOR RETENTION OF A FRAGILE CONDUCTIVE TRACE WITH A PROTECTIVE CLAMP

This is a divisional application Ser. No. 08/369,066 filed on Jan. 5, 1995 now U.S. Pat. No. 5,653,599.

TECHNICAL FIELD

The present invention relates to a method and apparatus for retaining a conductive trace (also known as a flexible, circuitized substrate) on a unitary clamp, and more particularly to an interconnect system designed to mount, secure, and protect a conductive trace having a multi-lead integrated circuit. A clamp, when assembled with a conductive trace having an integrated circuit, permits safe storage of the device, mounting of the device for testing of the electronic components, and safe and accurate mounting of the assembly on a printed circuit board during production of the latter.

BACKGROUND OF THE INVENTION

The density of integrated circuits continues to increase and as a result, the number of delicate leads between the integrated circuit and a printed circuit board likewise increases. A difficult problem still confronting engineers in the electronics industry is an efficient and reliable way to secure an integrated circuit to a board while maintaining electrical connection and mechanical protection of the leads.

A fabrication process known in the electronics packaging art is tape automated bonding (TAB). A continuous tape of fragile conductive traces, similar to, but far more fragile than photographic film, provides a basis for mounting integrated circuits on each frame of the tape.

A metal pattern is formed on each frame of the conductive trace. These metal patterns radiate from the center of the trace where an integrated circuit is mounted to the peripheral edges of the frame to form leads. The circuit is mounted such that the contacts of the chip are mated with the corresponding metal pads in the central portion of the frame. These fragile conductive traces provide for electrical connection between the integrated circuit and the circuit board.

The manufacture of electronic components, subassemblies and assemblies requires a number of functionally different manufacturing operations. Manufacturing the fragile components, testing, and final assembly of the components are three different operations which are required. The complex and additive nature of these operations makes cost effective manufacturing difficult. Each operation requires unique and complicated equipment. To perform these operations is relatively expensive, and there is also a relatively high possibility for defects.

U.S. Pat. No. 5,099,392, entitled "Tape-Automated Bonding Frame Adapter System" and issued to the Hewlett-Packard company on Mar. 24, 1992, illustrates an adapter system for mounting an integrated circuit and conductive trace to a circuit board. This adapter system comprises three separate components to mount the frame to a circuit board by building a sandwich of parts. An adapter ring is positioned on the circuit board. A plurality of conductive elements are wrapped around members of the adapter ring to provide electrical connection between the circuit board and conductive trace. The conductive trace is mounted over the adapter ring. A seal is mounted over the conductive trace and finally a lid is provided over the entire assembly to protect the conductive trace. The entire assembly is secured in place by a number of fasteners (e.g., nuts and bolts).

U.S. Pat. No. 4,696,526, entitled "Carrier for Tape Automated Bonded Semiconductor Device" and issued to the Intel Corporation on Sep. 29, 1987, illustrates a device for mounting an integrated circuit and conductive trace to a base for electrical test of the integrated circuit. This device comprises two separate and complicated components to mount a conductive trace by building a sandwich of parts. A base is provided with a socket for receiving the trace. The trace is positioned within the base by a plurality of lugs. A cover is placed over the trace and locked in place with the base by a number of complimentary locking members.

U.S. Pat. No. 5,005,070, entitled "Soldering Interconnect Method and Apparatus For Semiconductor Packages" and issued to the Hewlett-Packard company on Apr. 2 1991, illustrates a device for attaching the outer leads of a semiconductor package to lands on a circuit board. This device comprises a frame structure that urges the edges of a semiconductor package to the board. The frame structure is secured in position either adhesively, or by the thermal deformation of stakes.

IBM Technical Disclosure Bulletin Vol. 34, No. 11 of April, 1992, pp. 234–236 and entitled, "Method of Bonding Tape Automated Bonding Packages Using Conventional Surface Mount Technologies", illustrates a temporary fixture that may be used in the assembly of a circuit module with a printed circuit board. The fixture temporarily grips the module in order to transport and place the module on a printed circuit board. After a solder process, the fixture releases the module and is removed for recycling, leaving the unprotected module behind. The circuit module is relatively thick and durable compared to the circuit trace contemplated herein.

The structures illustrated in the above documents have a number of significant deficiencies. Most systems have multiple components which are costly to manufacture. Aligning a sandwich of components on a circuit board is difficult, costly and time consuming. Such alignment is also prone to error.

Retention of a fragile conductive trace having an integrated circuit and retention on a circuit board in a unitary protective structure is not disclosed in the above documents. Typically, conductive traces having integrated circuits are stored and shipped separately from the mounting devices. Separate storing of the unprotected conductive traces is difficult due to the fragile nature of the traces and integrated circuits. This typically requires additional protective packaging for storage and shipping of components.

It is believed that an electronic package, clamp for use therewith and method for providing such a package which overcomes the aforementioned problems while assuring protection in the manner cited below would constitute a significant advancement in the art.

DISCLOSURE OF THE INVENTION

It is a primary object of the present invention to provide a unitary structure which permits retention of a very thin, fragile conductive trace having an integrated circuit on a circuit board.

It is another object of the invention to provide a clamp assembly that is useful for safe storage, placement in a circuit test apparatus, and mounting on a printed circuit board.

In a broad aspect of the invention, the invention comprises a clamp having a base member for providing rigid support to a conductive trace and a plurality of retention means extending downwardly from said base, each of said retention means having a retention section adapted for retaining engagement with a plurality of corresponding apertures in the conductive trace. Each of the retention means is further adapted for providing fastening engagement with a plurality of corresponding apertures in the substrate.

In another broad aspect of the invention, the invention comprises a conductive tracer and a clamp, the clamp having a base member. The base member includes a plurality of retention means extending downwardly from the base, each of these retention means having a retention section adapted for retaining engagement with a plurality of corresponding apertures in the conductive trace. Each of the retention means is further adapted for fastening engagement with a plurality of corresponding apertures in the substrate wherein the trace is retained with said clamp.

In another broad aspect of the invention, the invention comprises a conductive trace, a substrate and a clamp. The clamp includes a base member, the base member having a plurality of retention means extending downwardly from the base. Each of the retention means includes a retention section adapted for retaining engagement with a plurality of corresponding apertures in the conductive trace. Each of the retention means is further adapted for fastening engagement with a plurality of corresponding apertures in the substrate wherein said trace is retained with the clamp and the clamp is fastened to the substrate.

The invention may include a standoff means to space a lower surface of the base member a predetermined distance above the circuit board.

The invention may also include a locator such as an indentation trace formed in an upper surface of the base member to permit centering of a material cutter for removal of the clamp.

In one embodiment of the invention, the base member is formed by the upper surface, sidewall and lower surface of the clamp structure, the substrate being a printed circuit board. The retention means is a cylindrical post (e.g., formed of plastic) having a diameter that press fits within an opening of the conductive trace. The standoff means is a plurality of downwardly extending members disposed at the peripheral edge of the base member or, alternatively, a rim formed in the posts.

It is another object of the invention to provide a method of assembling a clamp with a fragile conductive trace having an integrated circuit wherein the trace is retained in the clamp.

It is another object of the invention to provide a method of assembling a clamp with a conductive trace having an integrated circuit, the method comprising the steps of acquiring a clamp from a clamp feeder and pressing the clamp onto a conductive trace, thereby retaining the conductive trace and integrated circuit within the clamp.

It is believed that such a structure and method will constitute a significant advancement in the art.

BRIEF DESCRIPTION OF THE DRAWINGS

FIG. 1 is a axonometric view of a conductive trace retained in a clamp mounted on a printed circuit board;

FIG. 2 is a top view of the clamp, in accordance with one embodiment of the invention;

FIG. 3 is a side view of the clamp illustrating the posts and the standoff, in accordance with one embodiment of the invention;

FIG. 4 is a bottom view of the clamp;

FIG. 5 is another side view of the clamp illustrating the posts and the standoffs;

BEST MODE FOR CARRYING OUT THE INVENTION

Figure 6A:
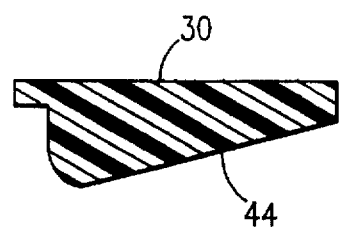
FIG. 6a is an expanded sectional view of the clamp taken along line C—C of FIG. 2, illustrating the profile of a lower surface of the clamp.

For a better understanding of the present invention, together with other and further objects, advantages and capabilities thereof, reference is made to the following disclosure and appended claims in connection with the above described drawings.

Referring to FIG. 1, a clamp assembly is generally illustrated at 10. An integrated circuit 14 located on a conductive trace (not visible) is retained in the clamp 12. The clamp 12 is mounted on a printed circuit board 16. The plurality of leads 18 of the conductive trace communicate with the plurality of pads 20 on the printed circuit board 16 for mechanical and electrical contact. In final form, the leads are preferably soldered to the pads.

Clamp 12 is preferably formed of plastic from an injection molding process and is suitable for withstanding high temperatures during a soldering process. The clamp also possesses mechanical stability to protect the fragile conductive trace and integrated circuit 14 from damage when assembled as shown in FIG. 1.

Referring to FIG. 2, features of the upper surface 30 of clamp 12 are shown. A rectangular shaped aperture 24 is formed in the center of clamp 12. Location and size of aperture 24 may be varied as long as the aperture permits visual inspection of information located on a upper surface of the integrated circuit (not shown in FIG. 2). Such information may include a part number, lot number, or some other related technical markings. During the assembly process or during diagnostics after such assembly, the integrated circuit must be readily identifiable. Aperture 24 permits identification without having to add equivalent information to the top surface of clamp 12.

A plurality of recesses 22 are formed along the four peripheral edges of clamp 12. These recesses 22 serve to permit visual inspection of leads 18 before assembly. After such assembly, recesses 22 permit a visual inspection of the solder joint (if soldering is used) between leads 18 of the conductive trace 80 (FIG. 10a) and pads 20 of printed circuit board 16 (refer to FIG. 1.)

In a preferred embodiment, clamp 12 is substantially square having a recess 22 at the peripheral edge of each side to permit inspection for each respective group of leads 18.

A bevel 26 is formed on one side of the upper surface 30. The bevel permits orientation of the clamp assembly for correct positional placement of the assembly on the printed circuit board as the assembly must be electrically aligned with the board. Bevel 26 also provides clamp orientation in a storage tube (not shown) and facilitates the use of vibratory feeders during the assembly process.

A plurality of indentations 28 (FIG. 6c) are also formed in the upper surface 30 of the clamp. These indentations 28 are formed directly over the downwardly extending posts 40 (FIG. 3). The diameter and depth of an indentation is selected to loosely receive an end of a post to permit tight stacking of clamps 12. The indentations also provide a visual indication from the upper surface 30 of clamp 12 to locate the posts 40 to facilitate removal of clamp 12 from a printed circuit board. A drill may be located over the indentation to drill down through upper surface 30 of clamp 12 and effectively remove post or tape material without damage to printed circuit board 16. This permits easy, accurate removal of the clamp assembly, e.g., upon electrical failure of integrated circuit 14, for non-destructive failure analysis of the circuit.

Referring now to FIGS. 3 and 5, side views of clamp 12 are shown. The clamp has a sidewall 46 formed of a suitable thickness to provide mechanical rigidity of the structure and protection of the fragile conductive trace and integrated circuit.

Clamp 12 is formed with an upper surface 30 and a lower surface 44. A plurality of posts 40 extend downwardly from lower surface 44. The posts engage apertures in the conductive trace (not shown) for retention of the conductive trace within clamp 12. The posts also engage apertures in the printed circuit board 16 (not shown) to retain the clamp 12 on the printed circuit board 16.

Sidewall 46 has a plurality of standoffs 42 (see especially FIG. 20b) extending downwardly at each corner of clamp 12. The standoffs (also seen in FIG. 20b) are of a predetermined length to control the height of the clamp in a predetermined spaced relationship with printed circuit board 16.

Clamp assembly 10 is effectively located on the printed circuit board and pressed downwardly onto the board until the standoffs engage the upper surface of the board, providing the desired spaced relationship. The purpose of this spaced relationship will be discussed later with reference to FIG. 20b.

Referring now to FIG. 4, a bottom view of clamp 12 is shown. From the lower surface 44, the downwardly extending posts 40 and standoffs 42 are shown. The cooperation between posts 40 and standoffs 42 permits retainment of the clamp assembly with the printed circuit board 16 at a predetermined height above the board. As seen in FIGS. 4 and 5 (and also in FIGS. 16–20b), the posts 40 are positioned more inwardly (toward the center) on the clamp's base member than the shorter length standoffs 42.

While the preferred embodiment illustrates four posts and four standoffs, those skilled in the art will appreciate that the number and placement of the posts and standoffs may vary without departing from the scope and spirit of the invention.

Figure 6B:
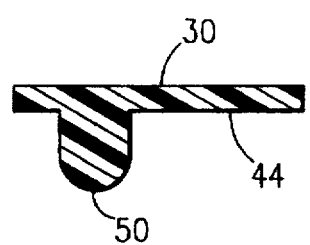
FIG. 6b is an expanded sectional view of the clamp taken along line C—C of FIG. 2, illustrating another embodiment of the profile of a lower surface of the clamp.

Referring now to FIG. 4 and FIGS. 6a and 6b (which represent possible cross sectional configurations viewable along line C—C of FIG. 2), two profiles of lower surface 44 are illustrated. This profile of the lower surface depresses the leads 18 of the conductive trace (not shown) downwardly, effectively forcing the leads 18 of the conductive trace down for engagement with pads 20 on printed circuit board 16 (FIG. 1).

In one embodiment of the invention, a rectangular ridge 50 is formed on the lower surface 44 of clamp 12, as shown in FIG. 6b. This ridge forms a rectangular shape around the lower surface 44 of clamp 12, as shown in FIG. 4. In another embodiment (FIG. 6a), lower surface 44 slopes downwardly and outwardly from the center of clamp 12 to depress the leads of the conductive trace. Posts 40 in turn retain a conductive trace 80 in a plane beneath the lower surface of the clamp. This plane is slightly above the lowest point of the lower surface or ridge in order to create the downward force on leads 18.

Sufficient downward force on leads 18 will only occur if the leads lie below the plane of the integrated circuit's solderable surface as will be later described with reference to FIG. 20b.

Figure 6C:
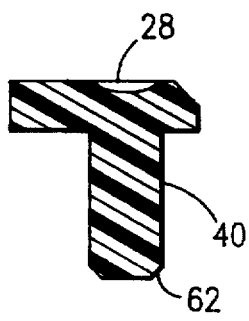
FIG. 6c is an expanded sectional view of the clamp as taken along the line A—A of FIG. 2, illustrating one embodiment of the posts of the invention.
Figure 6D:
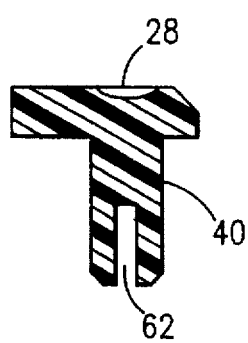
FIG. 6d is an expanded sectional view of the clamp taken along line A—A of FIG. 2, illustrating another embodiment of the posts.
Figure 6E:
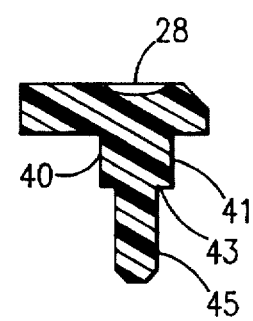
FIG. 6e is an expanded sectional view of the clamp taken along line A—A of FIG. 2, illustrating another embodiment of the posts.

Referring now to FIGS. 6c, 6d, and 6e, sectional views of three possible embodiments of posts 40 as may be seen if viewed along line A—A of FIG. 2 are provided. Each view illustrates the posts extending downwardly from the lower surface 44 of the clamp. As previously described, the posts provide retainment of the conductive trace in a spaced relationship with clamp 12 and also retainment of the clamp upon printed circuit board 16.

In one embodiment, shown in FIG. 6c, posts 40 are substantially cylindrical for engagement with apertures in the conductive trace 80 and apertures in printed circuit board 16. A chamfer 60 located along the lowermost surface of each post 40 aids engagement with these apertures.

In another embodiment, shown in FIG. 6d, the posts 40 are substantially cylindrical, having a slot 62 extending from the distant end of the post 40 inwardly to form two flexible post leg members. The slot 62 permits inward flexation of these post leg members to aid with engagement of the respective apertures and to provide a tight press fit within the apertures of the printed circuit board for retention of the clamp assembly 10.

In another embodiment, shown in FIG. 6e, integral standoffs are formed in the posts 40. In this embodiment, clamp 12 does not require the standoffs 42 (FIG. 20b) to provide the spaced relationship between the clamp and the printed circuit board. The post forms an upper cylindrical surface 41 and a lower cylindrical surface 45. The upper surface 41 communicates with the aperture 76 (FIG. 7) of the conductive trace 80, as previously described. The lower surface 45 communicates with the aperture 90 (FIG. 11) of the printed circuit board, as previously described. The apertures 90 and lower surfaces 45 are of a different diameter, being smaller than the upper cylindrical surface 41. The smaller diameter again must provide a tight press fit. A lip 43 is formed at the junction of the upper and lower surfaces. Lip 43 serves the function of a standoff by resting on the upper surface of printed circuit board 16. Lip 43 is positioned on the post to provide the predetermined spaced relationship between the clamp and printed circuit board.

Figure 7:
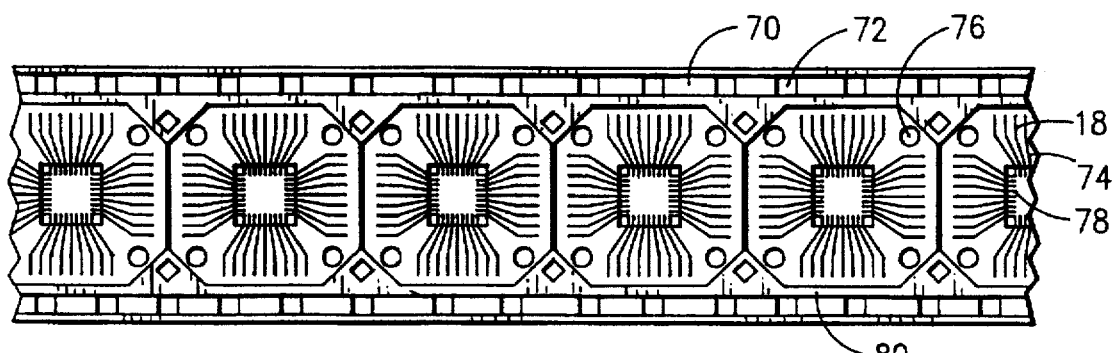
FIG. 7 is a top view of a tape with a plurality of conductive traces which form part thereof.

Referring now to FIG. 7, a tape 70 of conductive traces 80 is shown. A plurality of sprocket holes 72 are provided at the respective edges of the tape 70 to control movement of the tape during the manufacturing process.

Electrical connection between the integrated circuit and printed circuit board is achieved using conductive trace 80. Preferably, however, a plurality of leads and corresponding conductive traces 80 are provided. Leads 18 are for electrical engagement with pads 20 on printed circuit board 16. A plurality of contacts 78 secure and electrically engage the integrated circuit. A plurality of lands 74 (FIG. 7) electrically connect leads 18 with respective ones of the contacts 78.

Formed in each conductive trace 80 are a plurality (e.g., four) of apertures 76, each of which engages a post 40 for retention of the conductive trace 80 against clamp 12.

In one embodiment, four circular apertures 76 are provided to engage four cylindrical posts 40 on clamp 12. The diameter of the posts 40 and the diameter of the apertures 76 are such that a press fit occurs therebetween, thus providing retention of the fragile trace without damage during the assembly process. The apertures 76 formed in the fragile film of the conductive trace 80 are surrounded by metal patterns to strengthen the area for engagement with the posts. These strengthened areas resist tearing of the film when engaged by the posts 40. It is appreciated by those skilled in the art that minor changes to the number of, and shape of, posts and corresponding apertures may be made without departing from the scope and spirit of the invention.

Figure 8:
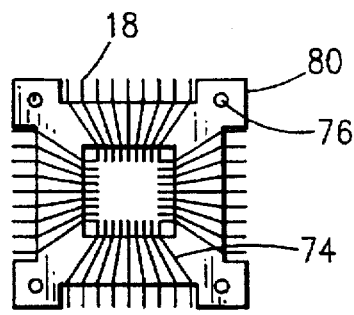
FIG. 8 is a single conductive trace excised from the tape of FIG. 7.
Figure 14:
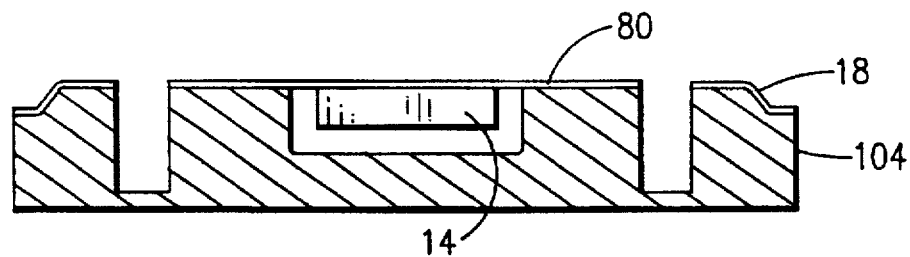
FIG. 14 is a schematic view of a die with a separated single trace.
Figure 15:
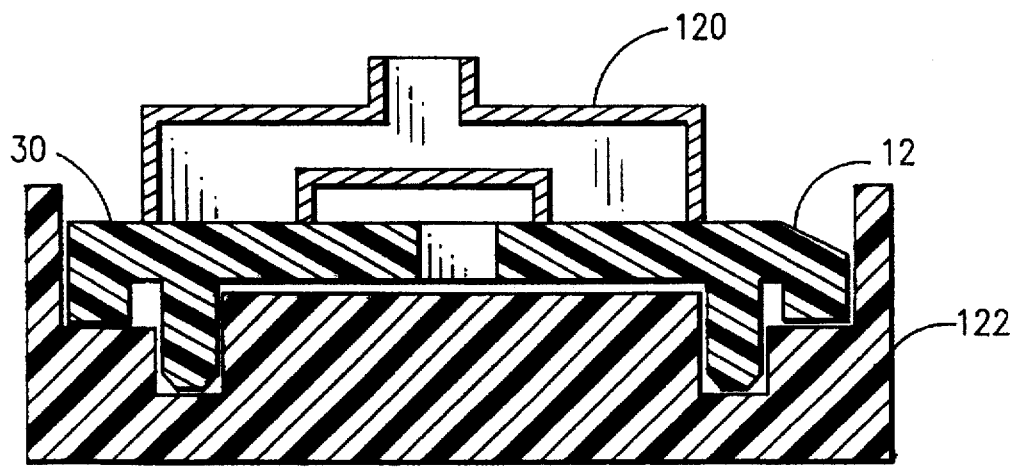
FIG. 15 is a schematic view illustrating acquiring a clamp from a feeder by a vacuum nozzle for placement on a single trace.

Referring now to FIG. 8, a single conductive trace 80 has been excised from tape 70. The trace's leads 18 are angularly formed (i.e., in an S shape), as shown in FIG. 14. Obviously, the leads could assume other shapes, i.e., a gull wing.

Figure 9:
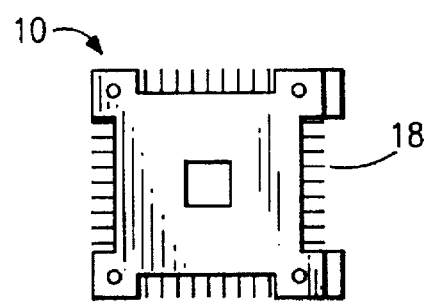
FIG. 9 is a top view of a conductive trace retained in the clamp.
Figure 10A:
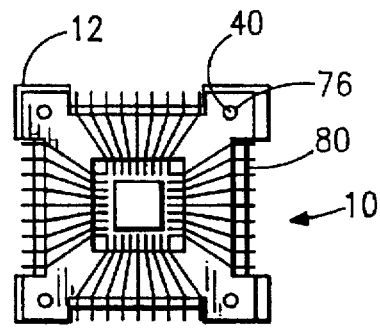
FIG. 10a is a bottom view of a conductive trace retained in the clamp.

Referring now to FIGS. 9, and 10a, a clamp assembly 10 is shown. The conductive trace 80 is retained in the clamp 12 by the engagement and cooperation between the plurality of apertures 76 in the conductive trace 80 and the plurality of posts 40 of the clamp. This assembly 10 may be stored in a shipping tube, or temporarily placed in a test apparatus and then removed, or retained on a printed circuit board. Integrated circuit 14 is not shown in FIGS. 9 and 10a.

Figure 10B:
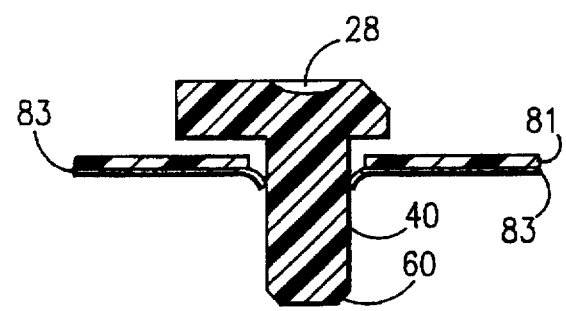
FIG. 10b is an expanded sectional view of the clamp, illustrating an embodiment of the post cooperating with the trace.

Referring now to FIG. 10b, a sectional view of a post is shown cooperating with a conductive trace 80. The aperture formed in the conductive trace 80 includes a plastic layer 81 having a diameter slightly larger than the diameter of the post, and a copper layer 83 having diameter slightly smaller that the diameter of the post. A peripheral edge of the copper layer 83 deflects downward when a post is inserted into the aperture. The edge provides a biting engagement with the post, retaining the conductive trace 80 with the post.

Figure 11:
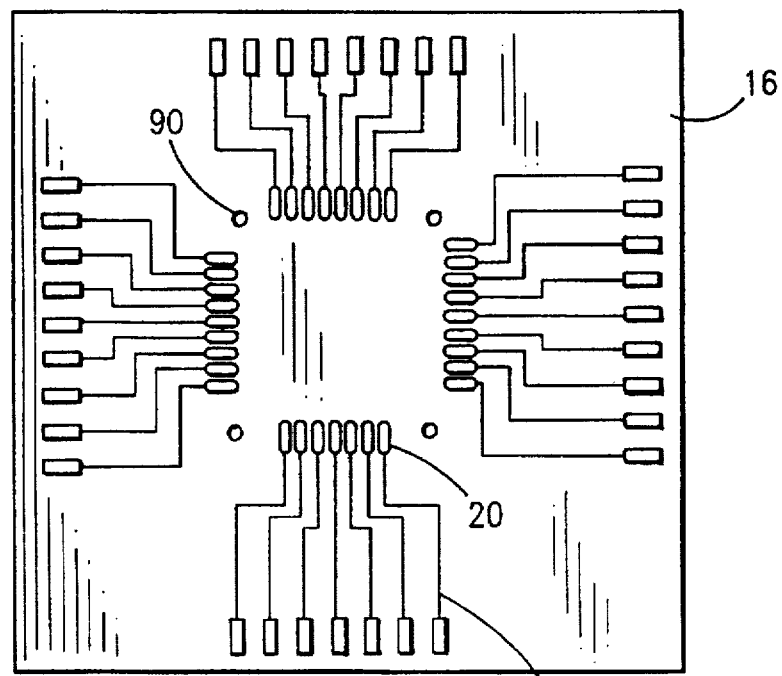
FIG. 11 is a top view of a printed circuit board, illustrating the apertures which communicate with the posts of the clamp to permit alignment of the clamp and the conductive trace with the layout on the circuit board.

Referring now to FIG. 11, a printed circuit board 16 is shown as configured to receive a clamp assembly 10. A plurality of pads 20 are arranged to engage the leads 18 of a conductive trace. The engagement is both mechanical, to secure contact by application of solder, and electrical. The pads 20 are electrically connected to other parts of the printed circuit board 16 by lands (lines) 92 etched on the board.

A plurality of apertures 90 are arranged in a predetermined spaced relationship on the board 16 for receiving a plurality of posts 40 of the clamp 12 (not shown). Those skilled in the art will appreciate that the arrangement of pads 20 and apertures 90 may be modified without departing from the scope and spirit of the invention.

Figure 12:
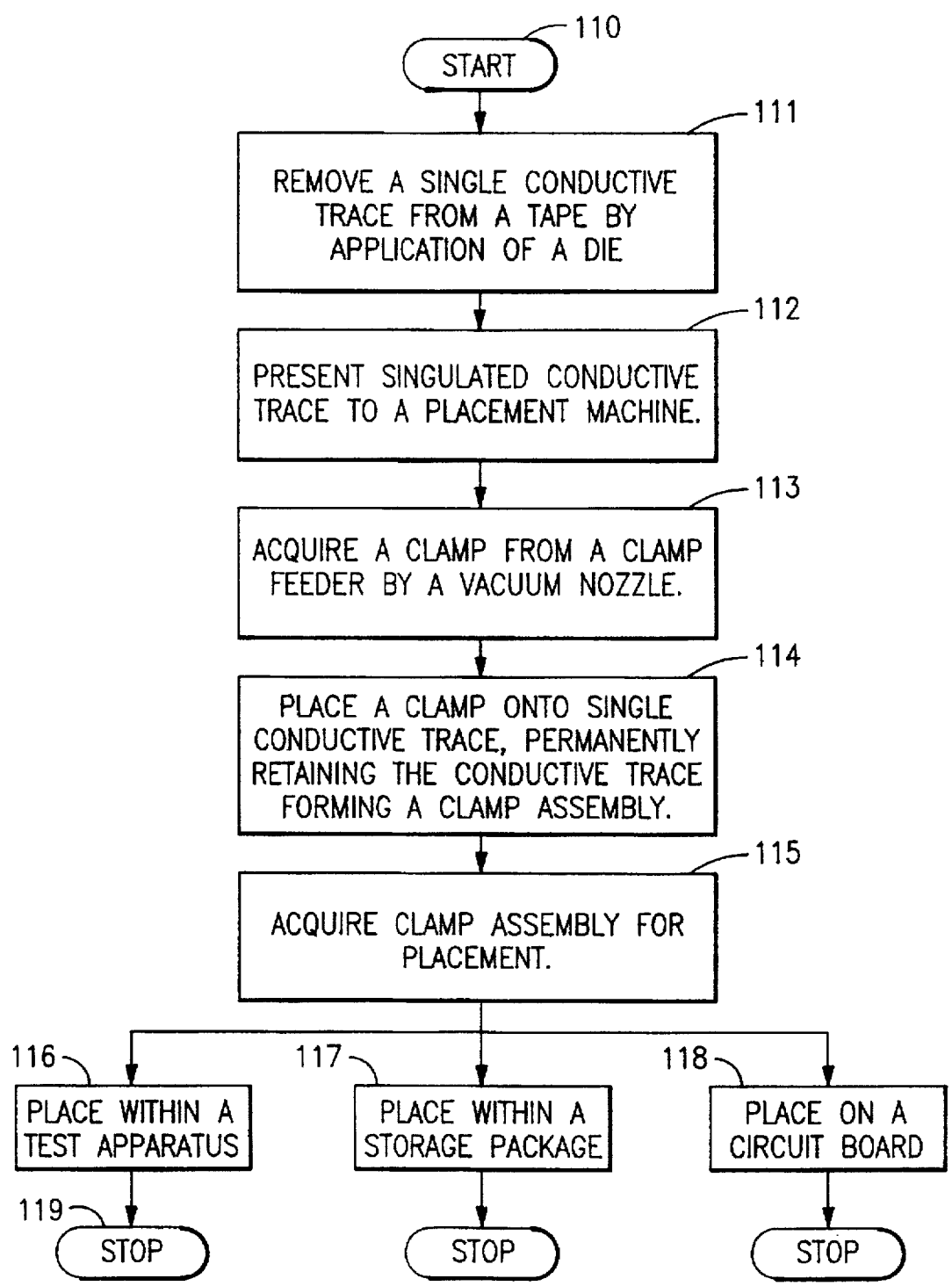
FIG. 12 is a flow chart of a method to assemble a clamp with a integrated circuit and a conductive trace in accordance with one embodiment of the invention.

Referring now to FIG. 12, the method to assemble a clamp with a conductive trace will be described. The method starts at 110. A single conductive trace having an integrated circuit is removed from a tape by application of a die to excise the trace. The leads are formed by the complimentary surfaces of the die pressing the leads into an substantially S-shape (111). As stated, other suitable shapes (e.g., a gull wing) are possible.

This single excised and lead formed trace is presented to a placement machine (112). A clamp is then acquired from a clamp feeder, for example by a vacuum nozzle (113).

The clamp is placed onto the single excised and lead formed trace where the posts 40 engage apertures 90. A downward force moves the posts through the apertures a predetermined distance, without damage to the conductive trace. This operation retains the conductive trace with the clamp (114). The completed assembly may now be acquired for placement (115).

The completed assembly of a clamp and trace may be placed in a storage package for shipping (117), or may be temporally placed in a test apparatus to electrically test the component (116), or may be mounted on a printed circuit board (118).

Referring to FIGS. 13 through 17, a schematic cross section of the apparatus and components for the method to assemble a clamp and conductive trace is shown.

Figure 13:
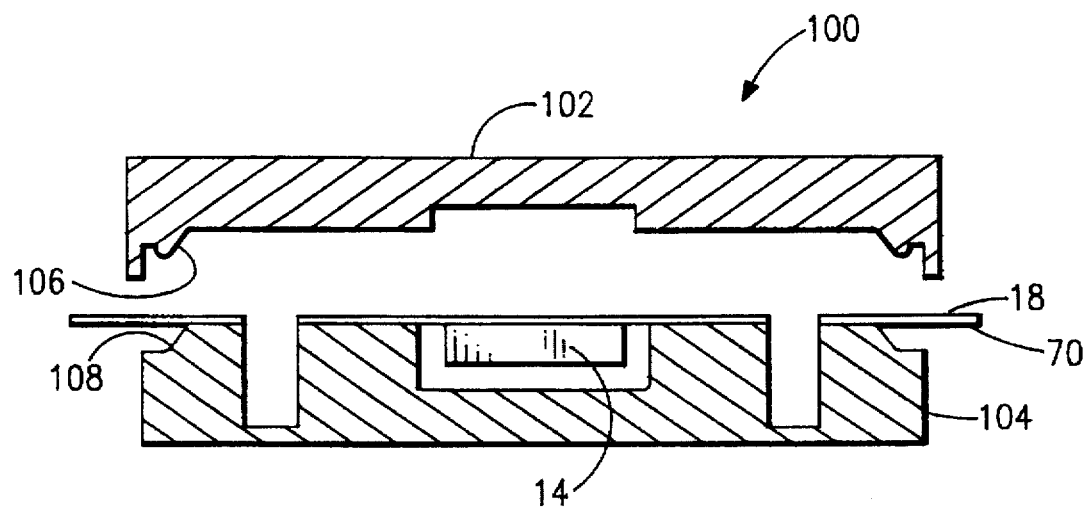
FIG. 13 is a schematic view of a die and plurality of conductive traces having integrated circuits before excise of a single trace.

In FIG. 13, a tape 70 of conductive traces 80 having integrated circuits 14 is fed to an excise and lead form die, generally indicated at 100. The die has an upper member 102 and a lower member 104. The upper member 102 is operable to communicate with the lower member 104 where a single conductive trace 80 may be excised from the tape. Significantly, the leads 18 may be formed during the same operation. The leads are formed into a shape by the contour 106 of the upper member 102 cooperating with the complimentary contour 108 of the lower member 104, thereby pressing the leads into shape. The result is a single conductive trace 80 as shown in FIG. 14.

A clamp is obtained from a clamp feeder 122 (FIG. 15) by a vacuum nozzle 120 and transported for engagement with a conductive trace located in the lower member 104 of the die. The vacuum nozzle 120 has a baffle over the aperture in the clamp to permit suction to effectively grip the upper surface 30 of the clamp.

Figure 16:
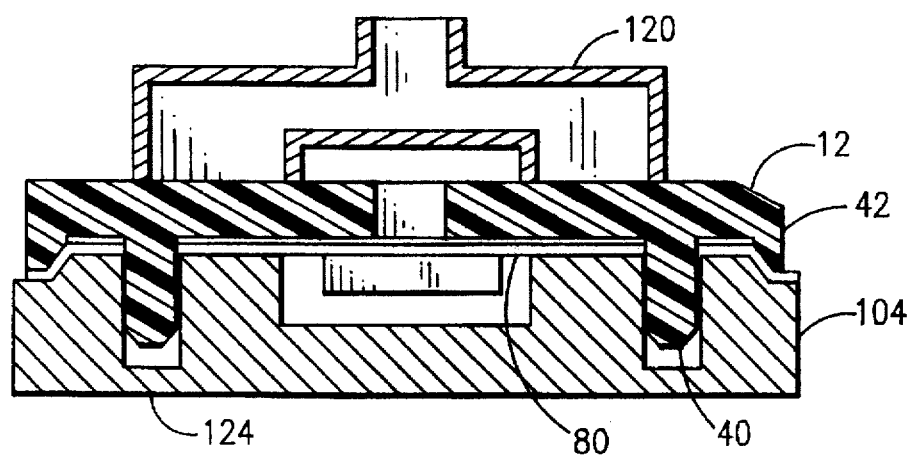
FIG. 16 is a schematic view of the clamp placed on a single conductive trace for retaining the trace.

As shown in FIG. 16, the clamp is aligned over the conductive trace 80. This alignment operation centers the posts 40 directly over the apertures 76 of trace 80. The lower member 104 of the die has a plurality of openings 124 directly under the apertures 76 of trace 80. The size of the openings must be large enough to loosely receive the posts 40 of the clamp 12 and small enough to support the surrounding area of the conductive trace 80 as placed in the die. A downward force drives the posts 40 through the apertures 76 (again, see FIG. 7) a predetermined distance to retain the conductive trace 80 in clamp 12. The posts 40 on the clamp are effectively press fit into apertures 76 on the trace without tearing or damaging the fragile conductive trace.

The lower member 104 of the die is contoured so that the standoffs 42 of the clamp do not touch or engage the surface of die 104. This permits the clamp 12 to be pressed downward to unrestrictively receive the conductive trace 80 in a predetermined spaced relationship without interference by the standoffs.

Figure 17:
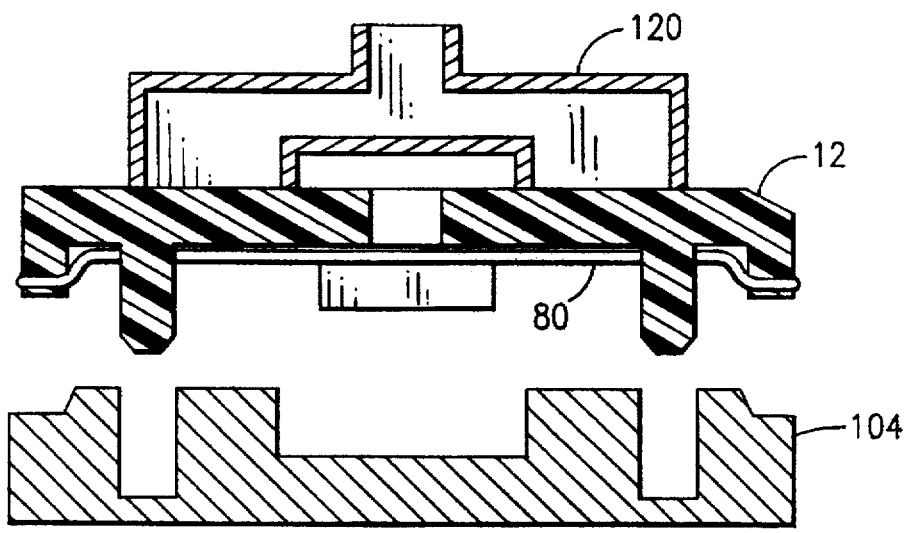
FIG. 17 is a schematic view of removal of the completed assembly of the clamp and conductive trace.

A completed assembly of a conductive trace 80 having an integrated circuit retained in a clamp 12 is removed from the die as shown in FIG. 17. As stated, this assembly may be placed in a test cell, a storage container, or provided for final assembly on a printed circuit board.

Figure 18:
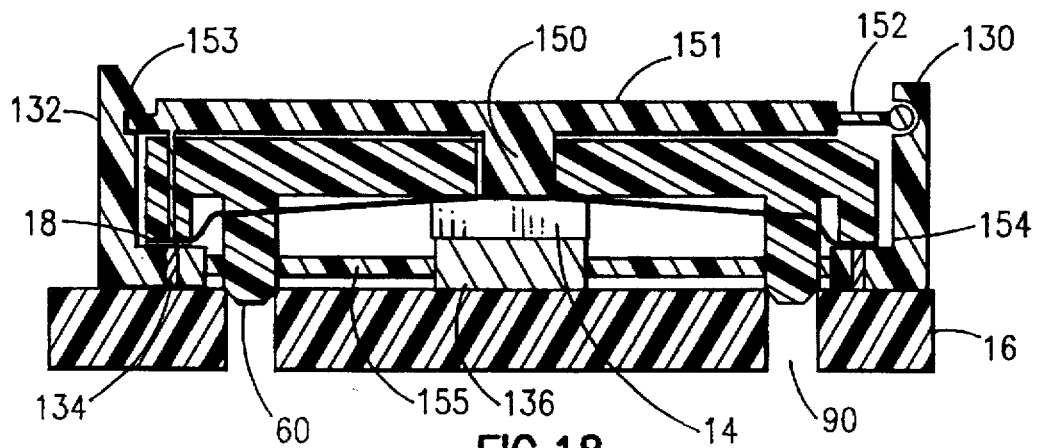
FIG. 18 is a schematic view of the completed assembly located in a test apparatus.

Referring to FIG. 18, a completed assembly is shown in a test apparatus 130. The test apparatus 130 may be soldered directly in place to a printed circuit board 16 in place of a completed clamp assembly 10. The test apparatus 130 acts as an interposer between the clamp assembly (while under electrical test) and the printed circuit board 16.

The test apparatus 130 is substantially a bottomless square box with an operable lid 151. A plastic gate 132 pushes leads 18 onto its own contact pads 134 for electrical engagement. The upper surface of the integrated circuit 14 is also pressed against a copper slug 136 by a protruding member 150 formed on the lower surface of lid 151. A surface of the integrated circuit 14 communicates with a surface of the slug 136 in order to dissipate heat generated by the integrated circuit 14 while under electrical test.

Thus the test apparatus provides both electrical and thermal contact of the integrated circuit 14 for burn-in testing of the integrated circuit 14 as retained within the clamp assembly 10.

The lid 151 is pivotally connected at one end 152 to the side of the test apparatus and releasably connected at another end 153. These connections permit the lid 151 to operate from a closed position for testing to an open position for insertion and removal of a clamp assembly. The lid 151 is releasably locked in the closed position in order to provide a downward force on the integrated circuit 14 by the protruding member 150.

A plurality of copper posts 134 are soldered to pads on the printed circuit board 16. The copper posts 134 extend upwardly through the bottom 155 of the test apparatus 130 to form exposed pads 154. The leads 18 of the conductive trace 80 respectively contact the exposed pads 154 for electrical connection during test of integrated circuit 14. The height of the copper posts 134 and slug 136 are such that the posts of clamp 12 do not engage the apertures 90 of the printed circuit board 16 in order to permit removal of clamp 12 after the burn-in test. The bottom 155 has a plurality of openings to loosely receive the posts 40.

The test apparatus 130 and gate 132 are designed so that the leads 18 of the conductive trace 80 are not deformed. This allows the clamp assembly 10 to be removed from the test apparatus 130 after burn-in for later use, e.g., in the production of a printed circuit board.

Figure 19:
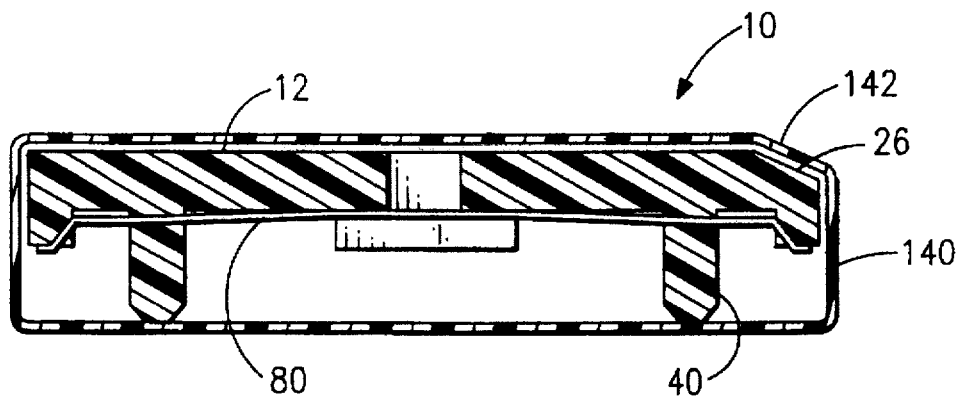
FIG. 19 is a schematic view of the completed assembly located in a shipping tube.

Referring to FIG. 19, a completed assembly 10 is shown in a tube container 140 for storage and shipping. The overall shape of the clamp 12 cooperates with the overall shape of the tube container 140 to provide a single orientation of the clamp 12 within the container. The chamfer 26 of the clamp 12 communicates with a corresponding chamfer 142 of the container wherein these chamfers must be aligned before inserting clamp 12 into tube 140. The inside dimensions of the tube are such that the clamp assembly 10 may be slidably received and removed from the tube. A single tube 140 may contain a plurality of clamp assemblies 10 (e.g., in edge-to-edge orientation directly behind the assembly 10 in FIG. 19).

Clamp 12 protects the fragile conductive trace 80 from damage that may occur from the top or sides of the clamp. The four corners of the clamp extend beyond the ends of the outer leads of the conductive trace 80 to protect the ends of the leads 18 from handling damage. This is best seen on the left side of clamp 12 in FIG. 19.

In addition, the four posts 40 protect the outer leads 18 from below. These posts 40 partially prevent damage of the trace 80 from underneath by raising the trace above a smooth or level contacting surface. It can thus be seen in the Figures (especially FIGS. 16-20b) that the portion of trace 80 having chip 14 thereon is positioned immediately adjacent the clamp's undersurface (excluding posts and standoffs) and therefore at a distance from this undersurface less than both lower (outermost) surfaces of posts 40 and standoffs 42 to thereby enhance the aforementioned protection provided by clamp assembly 10.

When the clamp assembly is placed in tube 140, the trace 80 is completely protected from damage, e.g., as may occur to the trace's underside.

Tubes 140 containing these clamp assemblies 10 may be shipped without damage to the printed circuit board assembly plant. The tube 140 may be used in a manufacturing process and further indicates (by its shape) the orientation of clamp(s) contained therein for eventual placement on printed circuit boards.

Figure 20A:
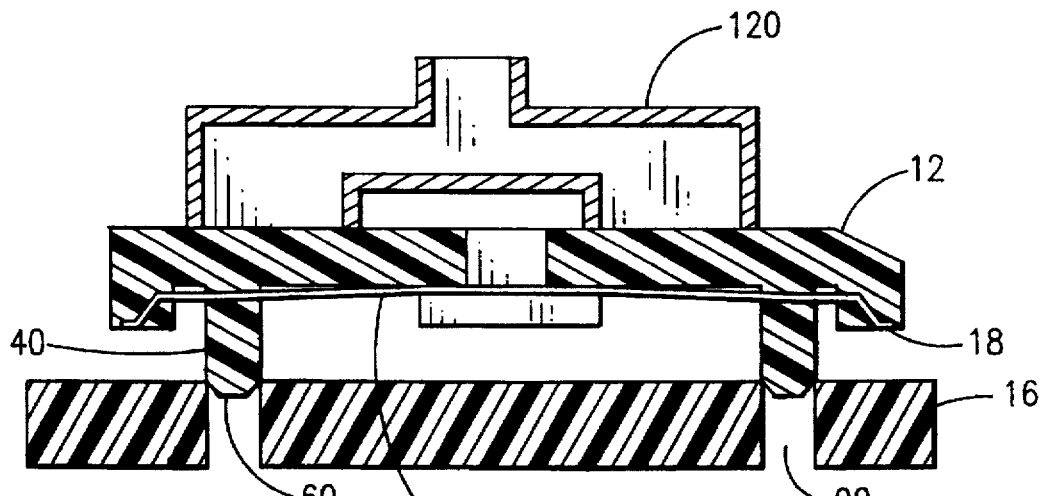
FIG. 20a is a schematic view illustrating placement of the completed assembly onto a printed circuit board.
Figure 20B:
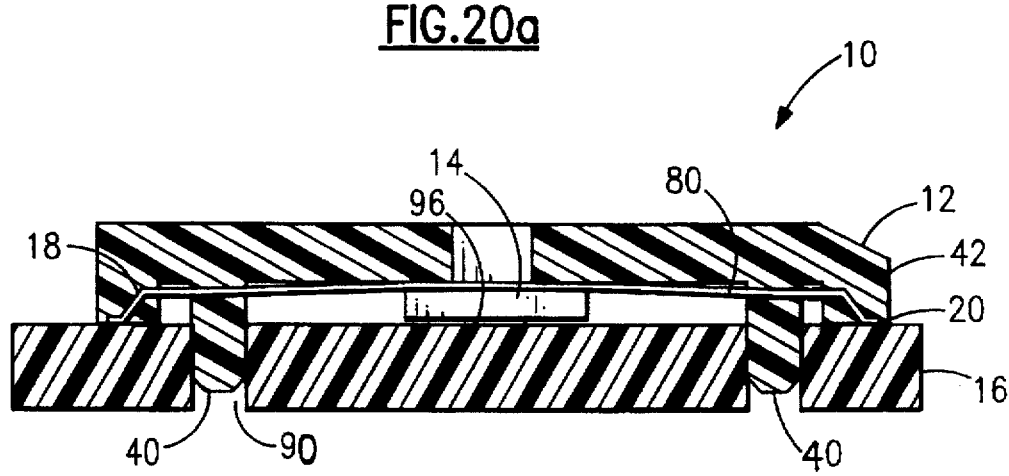
FIG. 20b is a schematic view illustrating the completed assembly located on a printed circuit board.

Referring to FIGS. 20a and 20b, a completed clamp assembly 10 is shown immediately before and after mounting on a printed circuit board 16. A placement machine acquires an assembly from a feeder and locates the assembly over a printed circuit board 16. The posts 40 of the clamp 12 are aligned over apertures 90 in the printed circuit board. The machine pushes clamp 12 downward onto the board. Clamp 12 and conductive trace 80 are retained on the board by the posts 40 press fitting into the apertures 90 on the board. The clamp 12 is eased down onto the board. The chamfers 60 on the posts 40 assist with engagement between the posts 40 and apertures 90. The clamp 12 is then pushed down until the standoffs 42 engage the upper surface of the board to engage the outer leads 18 of the trace 80 into solder paste which have been previously screened onto the printed circuit board 16.

The ridge 50 (FIG. 3) depresses the leads 18 of conductive trace 80 downwardly, effectively forcing the leads 18 of the conductive trace into engagement with the pads 20 of the printed circuit board 16, prior to a soldering process.

The posts 40 engage the apertures 90 of the printed circuit board 16 for retention of the clamp 12 on the board. The length and diameter of the posts 40 and length diameter of the apertures 90 are such that a tight press fit occurs between the sidewall of the post and the sidewall of the aperture, preventing removal of clamp 12 from the board.

The posts 40 provide retention of the fragile conductive trace 80 relative to the printed circuit board, once assembled to the printed circuit board 16.

The standoffs 42 rest on the upper surface of the board to provide a predetermined spaced relationship between clamp 12 and the board's upper surface. This spaced relationship permits forced engagement of the contacts 18 with the pads 20 and retains the integrated circuit 14 at a distance above the printed circuit board 16.

Once a clamp assembly 10 is mounted on a printed circuit board 16, it provides mechanical protection to the delicate structure.

The printed circuit card assembly may then be passed through a surface mount technology solder reflow oven to form the various solder joints. The clamp 12 remains in place on the printed circuit board 16 to provide mechanical protection to the fragile conductive trace 80 and integrated circuit 14. A surface of the integrated circuit may be soldered to the printed circuit board 16 to provide for cooling of the circuit. Optionally, an adhesive may be applied to the back bond of the integrated circuit to provide for cooling.

While there have been shown and described what are at present considered the preferred embodiments of the invention, it will be obvious to those skilled in the art that various changes and modifications may be made therein without departing from the scope of the invention defined by the appended claims.

What is claimed is:

1. A method of assembling a clamp to a conductive trace having an integrated circuit electrically coupled thereto, said method comprising the steps of:

acquiring a clamp from a clamp feeder, said clamp including an undersurface, a plurality of posts extending a first distance from said undersurface and a plurality of standoffs extending a second distance less than said first distance from said undersurface; and placing said clamp onto a conductive trace including a portion having an integrated circuit positioned thereon and a plastic layer and a conductive layer each including apertures therein such that the apertures of said plastic layer are of a larger diameter than said extending posts of said clamp and said apertures of said conductive layer are of a lesser diameter than said extending posts to retain said conductive trace and said integrated circuit within said clamp, said placing of said clamp including the step of extending said posts through said apertures of both said plastic layer and said conductive layer of said conductive trace and engaging said conductive trace with said standoffs such that said portion of said conductive trace having said integrated circuit positioned thereon is located adjacent said undersurface of said clamp at a distance less than said second distance of said extending plurality of standoffs to thereby protect said conductive trace and said integrated circuit positioned thereon.

2. The method of claim 1 further comprising, prior to said step of acquiring said clamp, the step of presenting said conductive trace having an integrated circuit electrically coupled thereto to a placement machine.

3. The method of claim 2 further comprising:

prior to said step of presenting, the step of removing said conductive trace having said integrated circuit electrically coupled thereto from a tape using a cutting die.

4. The method of claim 1 further comprising the step of temporarily placing said clamp and conductive trace having said integrated circuit electrically coupled thereto in a test cell for electrically testing said integrated circuit and said conductive trace.

5. The method of claim 1 further comprising the step of temporarily placing said clamp and conductive trace and integrated circuit in a storage package.

6. The method of claim 1 further comprising the step of placing said clamp, said conductive trace and said integrated circuit on a printed circuit board.

7. The method of claim 6 wherein said printed circuit board includes a plurality of holes therein, said posts extending from said undersurface and passing through said apertures within said conductive trace to be positioned within respective ones of said holes.

* * * * *